US010538857B2

(12) United States Patent
Malek et al.

(10) Patent No.: US 10,538,857 B2
(45) Date of Patent: Jan. 21, 2020

(54) MODULAR SPACE TETHER

(71) Applicant: Modular Space Tether, Inc., Vista, CA (US)

(72) Inventors: Christopher Malek, Vista, CA (US); Nigel E. Sharp, Anchorage, AK (US); Annemarie Heijna, Vancouver (CA); Philip Chow, Reston, VA (US)

(73) Assignee: Modular Space Tether, Inc., Vista, CA (US)

( * ) Notice: Subject to any disclaimer, the term of this patent is extended or adjusted under 35 U.S.C. 154(b) by 186 days.

(21) Appl. No.: 15/753,793

(22) PCT Filed: Aug. 20, 2016

(86) PCT No.: PCT/US2016/047932
§ 371 (c)(1),
(2) Date: Feb. 20, 2018

(87) PCT Pub. No.: WO2017/031482
PCT Pub. Date: Feb. 23, 2017

(65) Prior Publication Data
US 2018/0244408 A1  Aug. 30, 2018

Related U.S. Application Data

(60) Provisional application No. 62/207,773, filed on Aug. 20, 2015.

(51) Int. Cl.
*B64G 4/00* (2006.01)
*C30B 15/02* (2006.01)
(Continued)

(52) U.S. Cl.
CPC ............... *C30B 15/02* (2013.01); *B64G 1/58* (2013.01); *B64G 1/648* (2013.01); *B66D 1/12* (2013.01);
(Continued)

(58) Field of Classification Search
CPC .. B64G 1/66; B64G 1/648; B64G 2001/1092; B64G 4/00; B64G 9/00
See application file for complete search history.

(56) References Cited

U.S. PATENT DOCUMENTS 5,085,018 A * 2/1992 Kitamura ............. H01Q 1/1235
                                                  52/108
5,419,516 A * 5/1995 Leipold ................. B64G 1/648
                                                  244/172.5
(Continued)

*Primary Examiner* — Richard G Davis
(74) *Attorney, Agent, or Firm* — Lewis Kohn & Walker LLP; Donald G. Lewis

(57) ABSTRACT

A tether for joining objects in space by centripetal force has a modular architecture. The modular architecture facilitates the deployment of the tether by facilitating its transport into space as unassembled modular components and its assembly in situ, after the components have been transported. The modular architecture also facilitates it repair, modification, and disassembly in situ. More particularly, the modular tether has design features that enable its assembly, repair, modification, and/or disassembly in situ while the modular tether remains under tension, i.e., while the modular tether continues to perform its function of joining two or more objects by the application of centripetal force. The modular architecture also enables new tether modalities, e.g., a tensile strength modality, a winch modality, a tension monitoring modality, a repair state modality, a situational awareness modality, and a temperature control modality.

21 Claims, 13 Drawing Sheets

(51) Int. Cl.
  *C30B 29/06* (2006.01)
  *C30B 15/20* (2006.01)
  *C30B 15/32* (2006.01)
  *C30B 30/04* (2006.01)
  *C30B 35/00* (2006.01)
  *B64G 1/58* (2006.01)
  *B64G 1/64* (2006.01)
  *B66D 1/12* (2006.01)
  *G01S 11/02* (2010.01)
  *G01S 19/13* (2010.01)
  *B64G 1/10* (2006.01)
  *G01P 15/18* (2013.01)

(52) U.S. Cl.
  CPC .............. *C30B 15/20* (2013.01); *C30B 15/32* (2013.01); *C30B 29/06* (2013.01); *C30B 30/04* (2013.01); *C30B 35/005* (2013.01); *G01S 11/02* (2013.01); *G01S 19/13* (2013.01); *B64G 1/10* (2013.01); *B64G 2001/1092* (2013.01); *G01P 15/18* (2013.01)

(56) References Cited

U.S. PATENT DOCUMENTS

| | | |
|---|---|---|
| 6,116,544 A | 9/2000 | Forward et al. |
| 6,173,922 B1 | 1/2001 | Hoyt et al. |
| 6,260,807 B1 | 7/2001 | Hoyt et al. |
| 6,286,788 B1 | 9/2001 | Hoyt et al. |
| 6,290,186 B1 | 9/2001 | Hoyt et al. |
| 6,386,484 B1 * | 5/2002 | Hoyt ............ B64G 1/648 244/158.2 |
| 6,419,191 B1 | 7/2002 | Hoyt et al. |
| 6,981,674 B1 * | 1/2006 | Dempsey ........ B64G 1/648 244/158.2 |
| 2004/0149485 A1 * | 8/2004 | Edwards ........ B64G 1/648 174/117 R |
| 2015/0076287 A1 * | 3/2015 | Dula ............ B64G 1/648 244/158.2 |

* cited by examiner

MODULAR SPACE TETHER

RELATED APPLICATIONS

This application claims priority from U.S. Provisional Application No. 61/207,733, filed on 20 Aug. 2015, the contents of which are hereby incorporated by reference herein.

TECHNICAL FIELD OF THE INVENTION

The invention relates to tethers. More particularly, the invention relates to modular tethers employable in space.

BACKGROUND

In general terms, a tether is a cord that anchors something movable to a reference point which may be fixed or moving. There are a number of applications for tethers, e.g., balloons, kites, anchors, and towing. Tethers employable in space share the same general functionality as terrestrial tethers, i.e., they both anchor a movable object to a reference point, but, due to the space environment, tethers employable in space often include special design features.

An exemplary space tether was developed by Professors Yoshiki Yamagiwa and Masahiro Nomi of Shizuoka University, Hamamatsu, Japan as part of a "space tethered autonomous robotic satellite-cube" (STARS-C). (See: *The Asahi Shimbin, Jul. 6, 2016,* "University Orbiter Set to Lift Space Elevator Technology.") STARS-C employs a tether measuring 100 meters long to connect two 10-centimeter cubes in low Earth orbit. The tether has a diameter of 0.4 millimeters and is made of Kevlar.

A series of failure resistant tethers employable in space have been described by Hoyt et al., e.g., U.S. Pat. Nos. 6,386,484; 6,290,186; 6,286,788; 6,260,807; 6,173,922; 6,116,544; and 6,419,191. Taken together, the tether design features disclosed in Hoyt's patent disclosures have significantly mitigated the potentially dire consequences of tether failure in space.

A problem not adequately addressed in the prior art was the fact that the transport of a fully functional tether into orbit is limited by the size and mass of the tether and the availability of transport rockets having the load capacity to transport the tether into space, particularly transport into a high altitude geosynchronous orbit. What was needed was a tether design that facilitated transport of the tether into space.

SUMMARY OF THE INVENTION

A tether having a fully modular design and employing modular components can be transported piecemeal into space and assembled in situ. The modular components are interchangeable with one another. In a preferred embodiment, the modular components are designed to facilitate robotic assembly in situ for constructing the entire tether while in orbit. In addition to solving the initial transport problem, the fully modular design also enables the replacement and removal of individual components, in situ, in the event of component damage or wear, and the reconfiguration of components, in situ, in the event a tether redesign or upgrade are desired. In a preferred embodiment, the replacement, removal, and reconfiguration are achieved robotically. Additionally, the interchangeability of components facilitates the storage of redundant components and/or the cannibalization of assembled components, as needed.

BRIEF DESCRIPTION OF FIGURES

FIGS. 1-5 also illustrate a process for installing a new or replacement cable within modular tether, while the tether remains under tension.

FIG. 1 illustrates a perspective view of a segment of a modular tether, showing a central tether module with two scaffold type junctions, i.e., an upper junction and a lower junction, connected to one another by five cables, two climbers, i.e., an upper climber and a lower climber, each engaged to respectively to one of the cables, and two taxis, one taxi being engaged to the scaffold of the upper junction and the other taxi being engaged to the scaffold of the lower junction. Above and below the central tether module, fragmentary views of two other tether modules are shown. A centrifugal field is applied along the length of the long axis of the tether. The two junctions of the central tether module are held in their relative positions within centrifugal field by the five cables that connect them.

FIG. 1B also illustrates an enlarged view of the taxi engaged to the scaffold of the upper junction. FIG. 1B also illustrates a process for coupling the taxi to the climber.

FIG. 2 illustrates a perspective view of the same segment of modular tether illustrated in FIG. 1, showing the upper climber of FIG. 1B after it has descended to a position adjacent to the upper junction. FIG. 2 also shows the beginning of a process whereby the lower climber couples to the spooled cable held by the upper climber. FIG. 2 also shows the movement of the taxi along the scaffold of the lower junction as it travels from one anchor position to another.

FIG. 2B also illustrates a process whereby the lower climber starts to descend down the cable to which it is engaged, for unspooling the spooled cable held by the upper climber.

FIG. 3 illustrates a perspective view of the same segment of modular tether illustrated in FIG. 2, showing the lower climber of FIG. 2B after it has traveled down the cable from the upper junction to the lower junction.

FIG. 4 illustrates a perspective view of the same segment of modular tether illustrated in FIG. 3, showing a process whereby the taxis engaged to the scaffolds of the upper and lower junctions travel from one anchor position to another, carrying the unspooled replacement cable in the process.

FIG. 5 illustrates a perspective view of the same segment of modular tether illustrated in FIG. 4, showing a process whereby the unspooled replacement cable decouples from the upper and lower climbers and couples to anchors on the upper and lower junctions while under tension.

DETAILED DESCRIPTION

Figure 1:
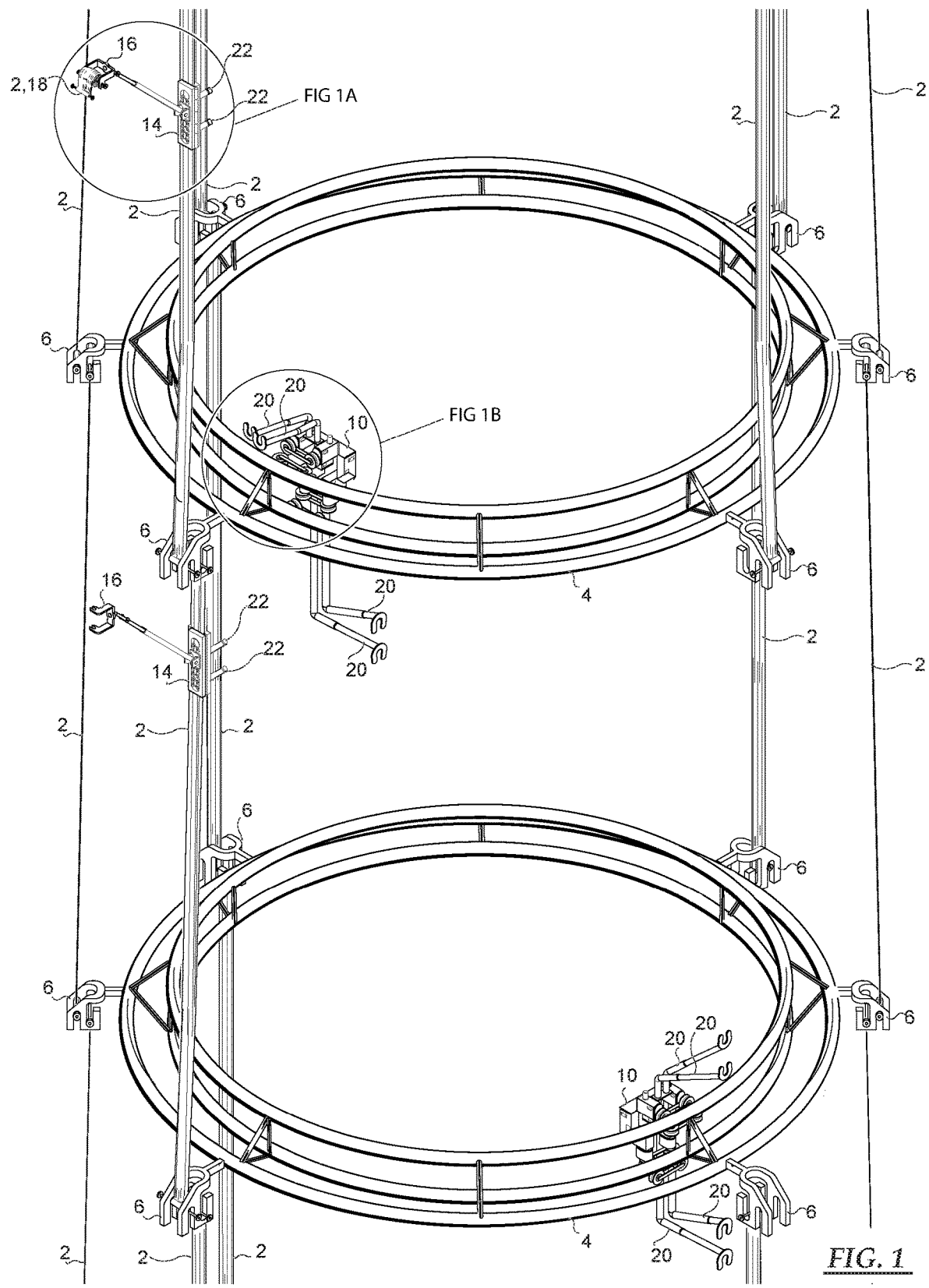
FIGS. 1-5 illustrate a segment of a modular tether. The segment includes one full tether module in the center and two fragmentary tether modules, i.e., one above and one below the central tether module. The full modular tether has many tether modules connected end to end with one another and extends far beyond the modular tether segment illustrated in FIGS. 1-5.

The invention relates to tethers employable in space for joining objects to one another by centripetal force. The invention discloses that, if such tethers are very long and are non-modular, they can be difficult to deploy due to their large mass. The invention teaches that the solution to that problem is to provide a modular tether that may be assembled, repaired, modified, and/or disassembled in situ, i.e, in space. The invention also teaches that, for space applications, it is preferred to assemble, repair, modify, and/or disassemble the modular tether while the modular tether remains under tension, i.e., while the modular tether continue to be in use for joining two or more objects with centripetal force. The invention includes mechanisms and methods for achieving this assembly, repair, modification, and/or disassembly while the tether is under tension.

A key aspect of the fully modular tether is its modularity. The modularity of the tether facilitates its transport into space and its in situ assembly there. The modularity of the tether further facilitates its in situ repair in space, the replacement of damaged parts, and its safety. The modularity of the tether may also facilitate the adaptability of the tether, with respect to the addition or reduction of length and/or variation of its tensile strength to adapt to changing loads or other conditions.

Modularity is the property of an object made by combining component parts, wherein the component parts are produced prior to assembly, the component parts are interchangeable with one another, and the component parts are separable from one another. Modularity enables a larger system to be constructed by combining multiple smaller subsystems. A system is considered to have "modularity" if it can be decomposed into a number of components that may be mixed and matched in a variety of configurations. Modularity employs the use of exchangeable parts and enabled the object to be constructed using different options. The modular components are able to connect, interact, or exchange resources, by adhering to one or more standardized interfaces.

The modularity of the components imparts systemic equivalence to the tether, i.e., individual modular components can be substituted for one another. The modularity of the components makes them recombinable and enables the tether to have an indeterminate form, i.e., it can be redesigned by rearranging the component parts in different ways. The modularity of the components and their recombinability enables the components to have an indeterminate use, i.e., they can be reconfigured for new uses. The fully modular tether is decomposable, i.e., the modular components can be separated from one another. The modularity of the components enables the tether to be expandable by adding more modules. The modular components are hierarchically nested throughout the tether, i.e., components within a given module interact more with one another than with components from different modules. Each modular component within the fully modular tether has domain specificity, i.e., each modular component performs only specific specialized functions, but these functions span the entire tether and may be employed throughout. The modular design of the tether enables the tether to be functionally partitioned into discrete scalable, reusable modules, characterized by the rigorous use of well-defined modular interfaces.

One aspect of the invention is directed to a modular tether for joining objects in space by centripetal force. The modular tether comprises a plurality of tether modules and a plurality of junctions for coupling the tether modules to one another end to end for forming the modular tether. The tether modules are attachable and detachable to and from the junctions while the modular tether applies centripetal tension. In a preferred embodiment, each of the tether modules includes a cable bundle having a plurality of parallel cables (2). In another preferred embodiment, each of the junctions includes a scaffold (4) with a plurality of anchors (6) attached thereto for reversibly fastening and unfastening the cables (2) of the cable bundles to and from the junction for assembling, disassembling, repairing, or modifying the modular tether in situ. In another preferred embodiment, one or more of the anchors (6) includes a power winch (8) for reversibly fastening and unfastening the cable (2) to and from the anchor (6) and for winding and unwinding the cable (2) to and from the junction for adjusting the tension or length of the cable (2) within the tether module. In another preferred embodiment, the modular tether further comprises a taxi (10) having roller coaster type wheels (12) for coupling to one of the junctions and a motive force for propelling the taxi (10) along the junction from one anchor (6) to another. In another preferred embodiment, the modular tether further comprises a climber (14) having a traction coupling with one of the cables (2) and a motive force for propelling the climber (14) by way of the traction coupling with the cable (2) from one junction to another. In another preferred embodiment, the traction coupling between the climber and the cables may be decoupled for detaching the climber from the cable. In another preferred embodiment, the modular tether is of a type for transporting cargo up and down the tether module and the climber includes an extendable claw (16) for holding cargo (18). In another preferred embodiment, the extendable claw is retractable. In another preferred embodiment, the modular tether further comprises a taxi (10) having roller coaster type wheels (12) for coupling with one of the junctions and a motive force for propelling the taxi (10) along the junction from one anchor (6) to another and a first half of a fifth wheeler type coupler (20) and the climber includes a second half of the fifth wheeler type coupler (22) for coupling to the taxi (10). In another preferred embodiment, the modular tether has a non-uniform tensile strength along its length in conformance with a tensile strength modality and each individual tether module has a tensile strength in conformance with the tensile strength modality of the modular tether. In another preferred embodiment, the modular tether further comprises a plurality of tension gauges, wherein each tension gauge is juxtaposed between adjacent tether modules and coupled thereto for monitoring the tension therein. In another preferred embodiment, the modular tether further comprises a plurality of repair state monitors. The repair state monitors are juxtaposed between adjacent tether modules and coupled both thereto and to a central computer for monitoring the repair state of the modular tether. In another preferred embodiment, the modular tether further comprises a plurality of GPS sensors attached to the tether modules and/or junctions and/or climbers and coupled to a central computer for providing positional awareness. In another preferred embodiment, the modular tether further comprises a plurality of radio transmitters attached to the tether modules and/or junctions and/or climbers for transmitting to ground based receivers for providing positional awareness. In another preferred embodiment, the modular tether further comprises a plurality of inertial measurement units attached to the tether modules and/or junctions and/or climbers and coupled to a central computer for providing positional awareness. In another preferred embodiment, the modular tether further comprises a plurality of heat sinks coupled to the tether modules and/or junctions for managing the temperature of the modular tether. In another preferred embodiment, the modular tether further comprises a plurality of radiator panels and heat transfer units coupled to the tether modules and/or junctions for managing the temperature of the modular tether. In another preferred embodiment, the modular tether has scalable length by adding or removing one or more tether modules to or from the modular tether. In another preferred embodiment, the plurality of tether modules includes five or more of said tether modules and the plurality of junctions includes six or more of said junctions.

Another aspect of the invention is directed to a process for increasing the tensile strength of a modular tether. The process comprises the following two steps. In the first step, centripetal tension is applied by a modular tether having a series of tether modules coupled to one another by junctions. While simultaneously, in the second step, a cable within one of the tether modules is attached to the junction to which the tether module is coupled and is tensioned therewith for increasing the tensile strength of the tether module while the modular tether continues to apply the centripetal tension of the first step.

Another aspect of the invention is directed to a process for decreasing the tensile strength of a modular tether. The process comprises the following two steps. In the first step, centripetal tension is applied by means of a modular tether having a series of tether modules coupled to one another by junctions. While simultaneously, in the second step of the process, a cable within one of the tether modules is detached from the junction to which the tether module is coupled and is de-tensioned therefrom for decreasing the tensile strength of the modular tether while the modular tether continues to apply the centripetal tension of the first step.

EXAMPLES

A process for installing a new or replacement cables within a modular tether under tension is illustrated in FIGS. 1-5. The disinstallation process is the reverse of the installation process illustrated in FIGS. 1-5. Processes for lengthening or shortening a modular tether employ the installation or disinstallation processes illustrated in FIGS. 1-5 at either extremity of the tether. Assembly or disassembly of a modular tether is achieved by lengthening or shortening processes respectively. Repair processes may be achieved by replacement.

Figure 1A:
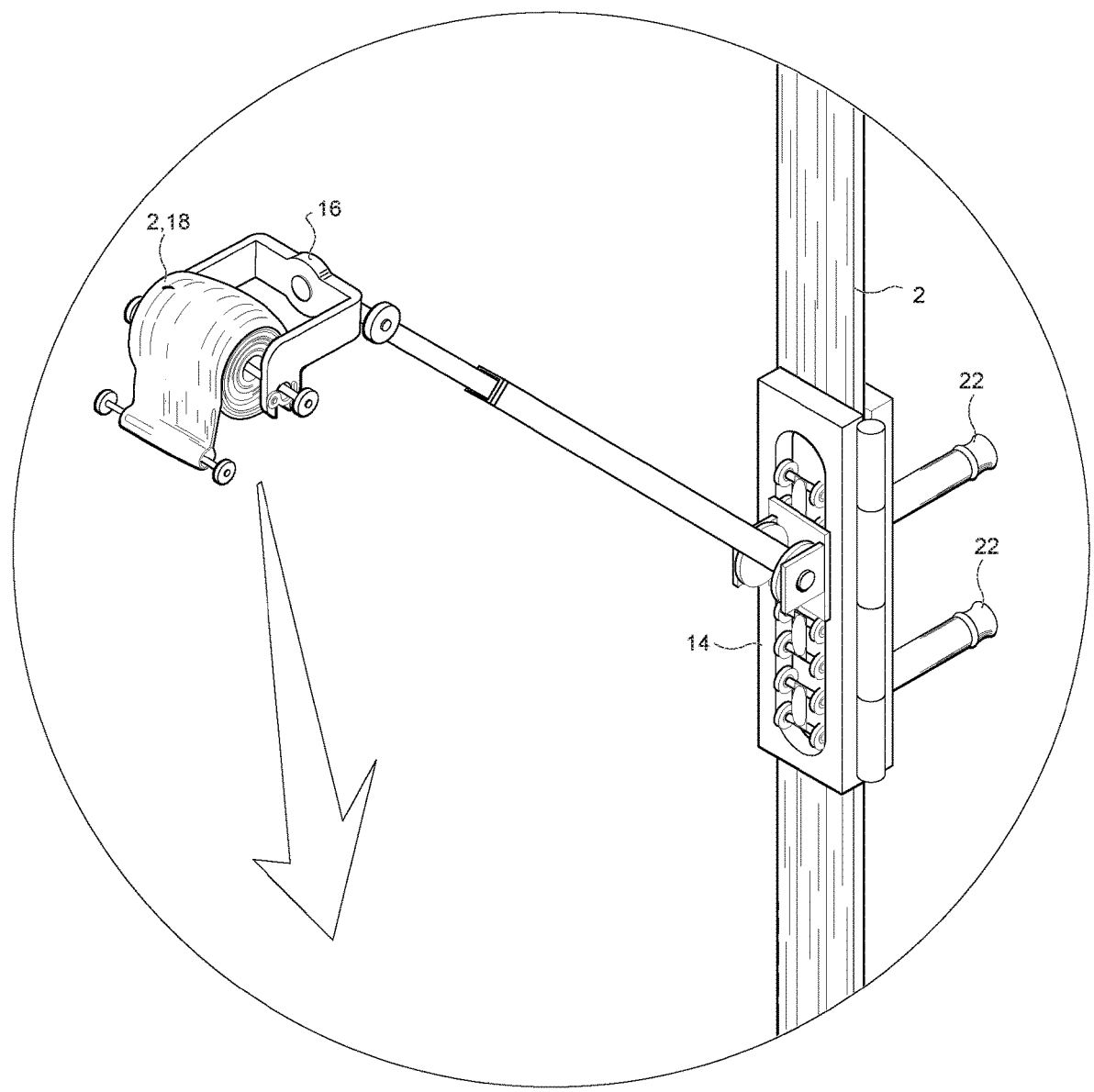
FIG. 1A illustrates an enlarged view of a detail of the modular tether of FIG. 1, showing the upper climber of FIG. 1 engaged to and travelling along one of the cables. The climber is carrying a spooled replacement cable.
Figure 1B:
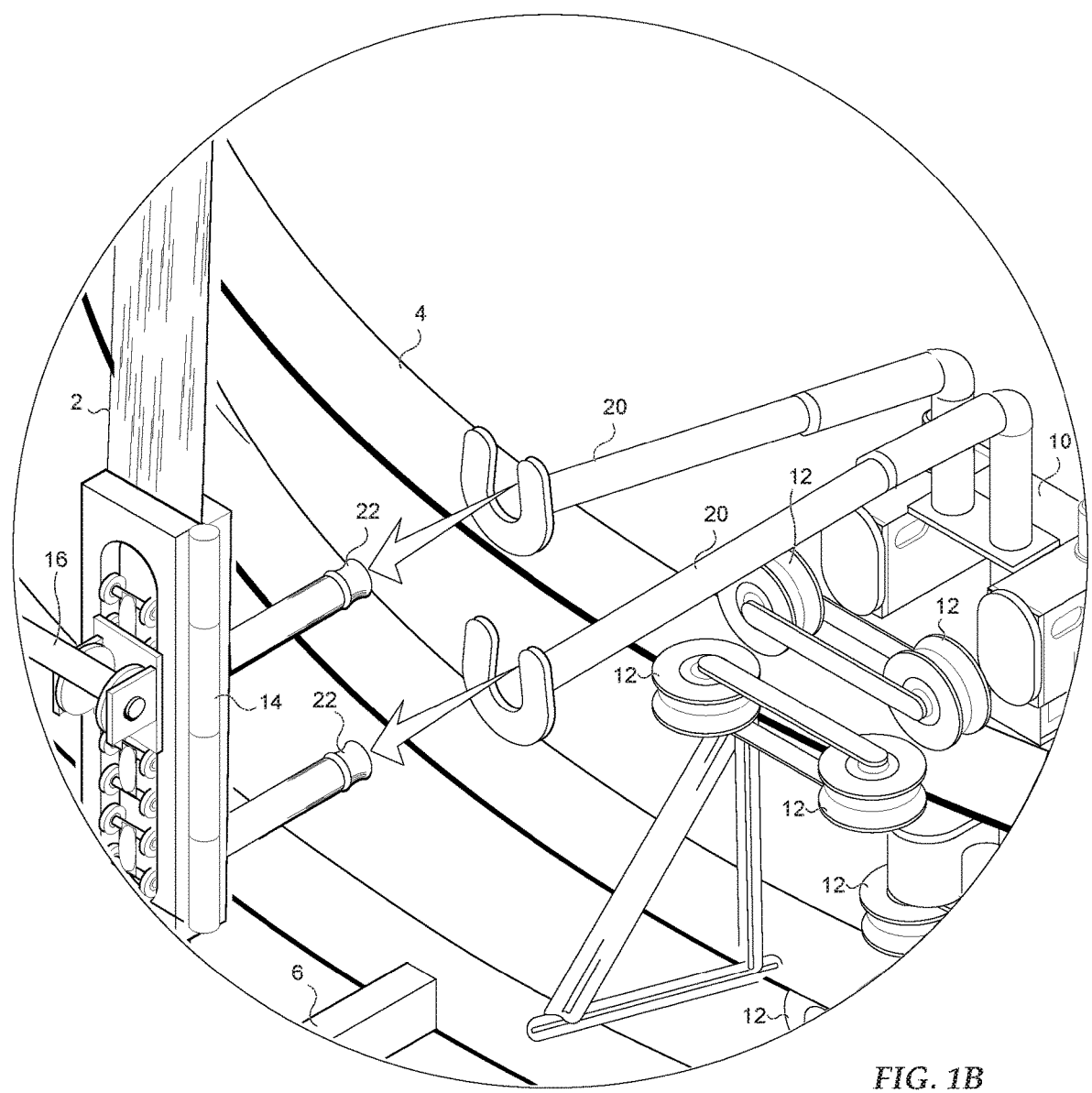
FIG. 1B illustrates an enlarged view of a detail of the modular tether of FIG. 1, showing the upper climber of FIG. 1A after it has travelled down the cable from its position in FIG. 1A to a new position adjacent to the upper scaffold type junction.

FIGS. 1, 1A, and 1B illustrate a process whereby a spool of new or replacement cable (2, 18) is delivered by a climber (14) for installation within a tether module, represented the cable bundle extending between and anchored to the upper and lower junctions (4) of FIG. 1. FIG. 1A illustrates an enlarged view of a spooled cable (2, 18) held by an extendable claw (16) carried by the climber (14), as the climber descends down one of the cables to which it is engaged of the tether module above the upper junction (4). FIG. 1B illustrates an enlarged view of the climber (14) after it has arrived at the tether module below the upper junction (4). FIG. 1B also illustrates the docking of the climber (14) with the taxi (10) on the upper junction (4). More particularly, the fifth wheeler type coupler (20) of the taxi (10) docks with the king pin of the fifth wheeler type coupler (22) of the climber (14).

Figure 2:
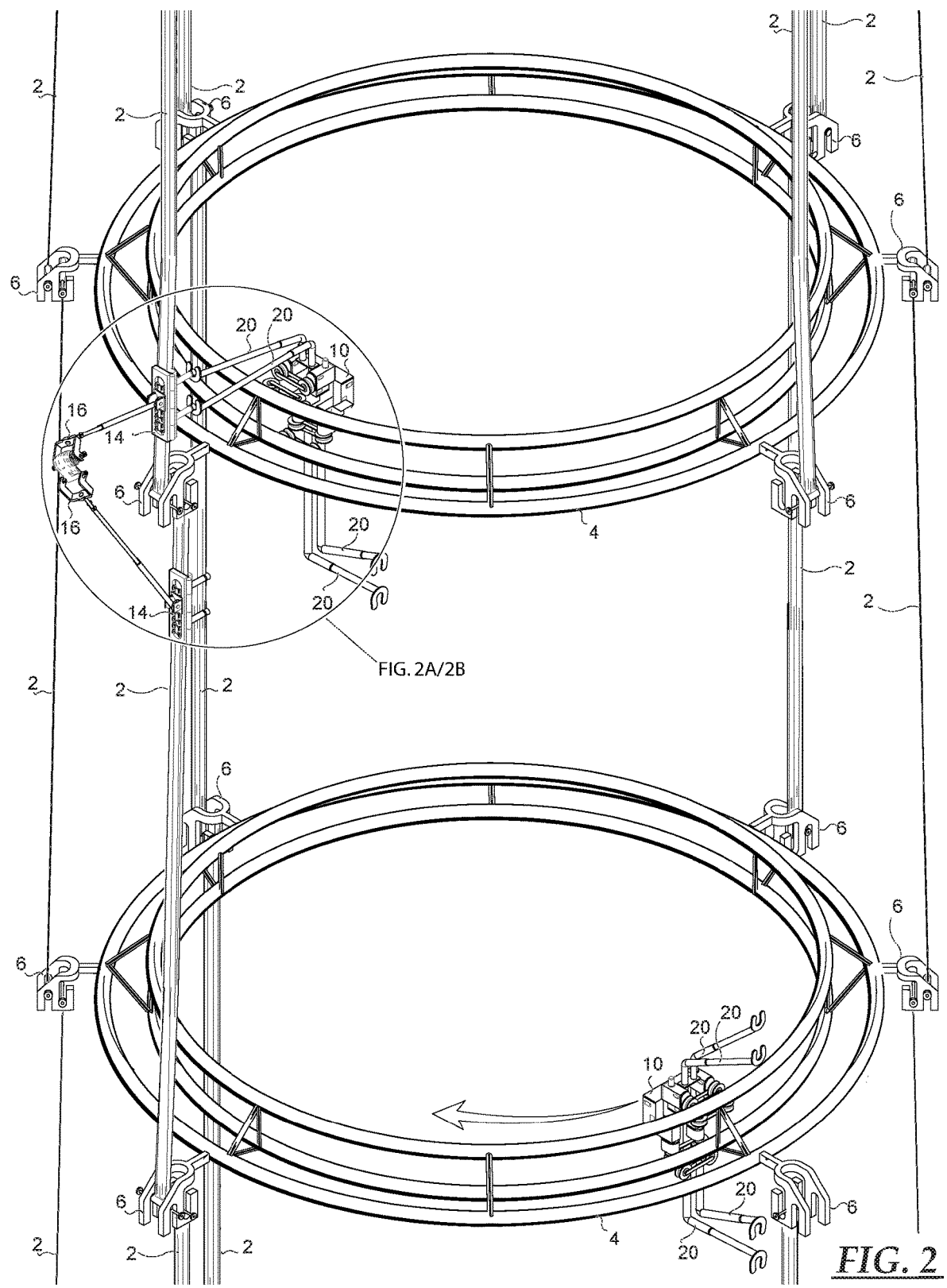
Figure 2A:
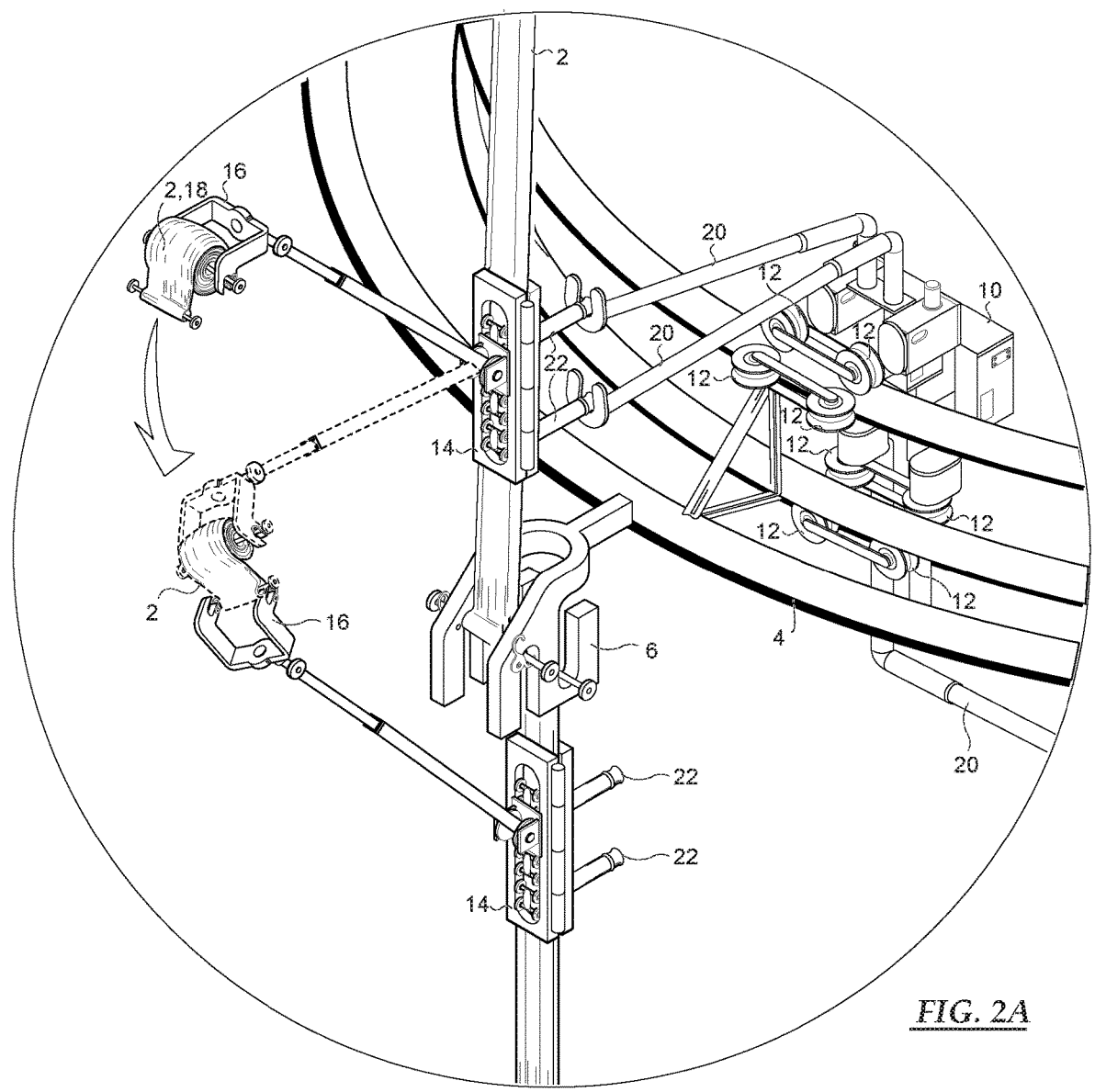
FIG. 2A illustrates an enlarged view of a detail of the modular tether of FIG. 2, showing in detail the process whereby the lower climber couples to the spooled cable held by the upper climber.
Figure 2B:
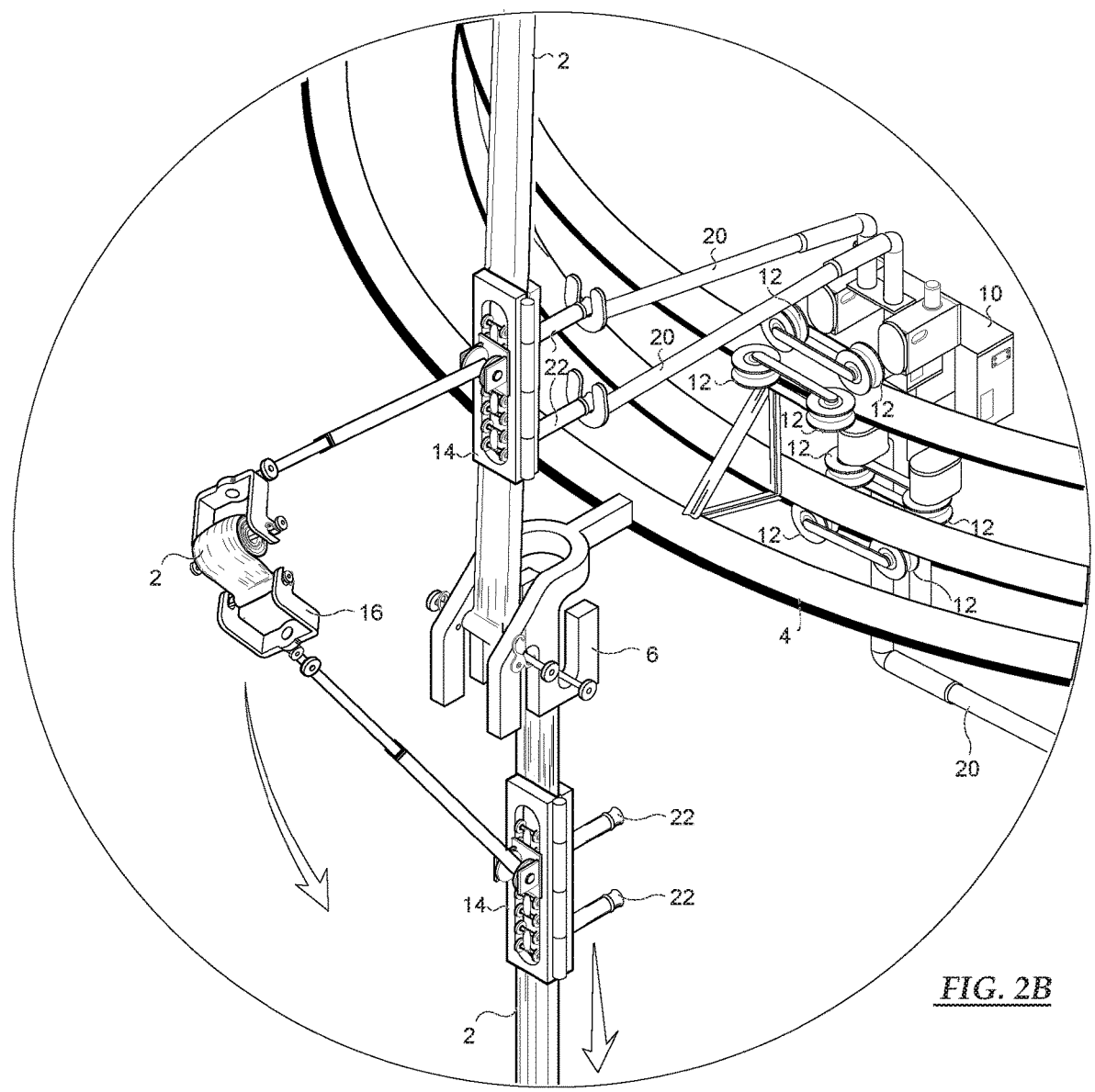
FIG. 2B illustrates an enlarged view of a detail of the modular tether of FIG. 2, showing the lower climber of FIG. 2A after it has coupled to the spooled cable held by the upper climber.

FIGS. 2, 2A, and 2B illustrate a process whereby the spool of new or replacement cable (2, 18), recently delivered to the tether module below the upper junction (4), is coupled to a second climber (14), which is engaged to and travels along a cable within the cable bundle belonging to the tether module between the upper and lower junctions (4). FIG. 2A illustrates the process whereby the spool of cable (2) is coupled to the lower climber (14). Once the spool of cable (2) is coupled to both the upper and lower climbers (14), the lower climber descends down the cable (2) to which it is engaged. This process is illustrated in FIG. 2B. The descent of the lower climber (14) causes the spool of cable (2, 18) to unspool.

Figure 3:
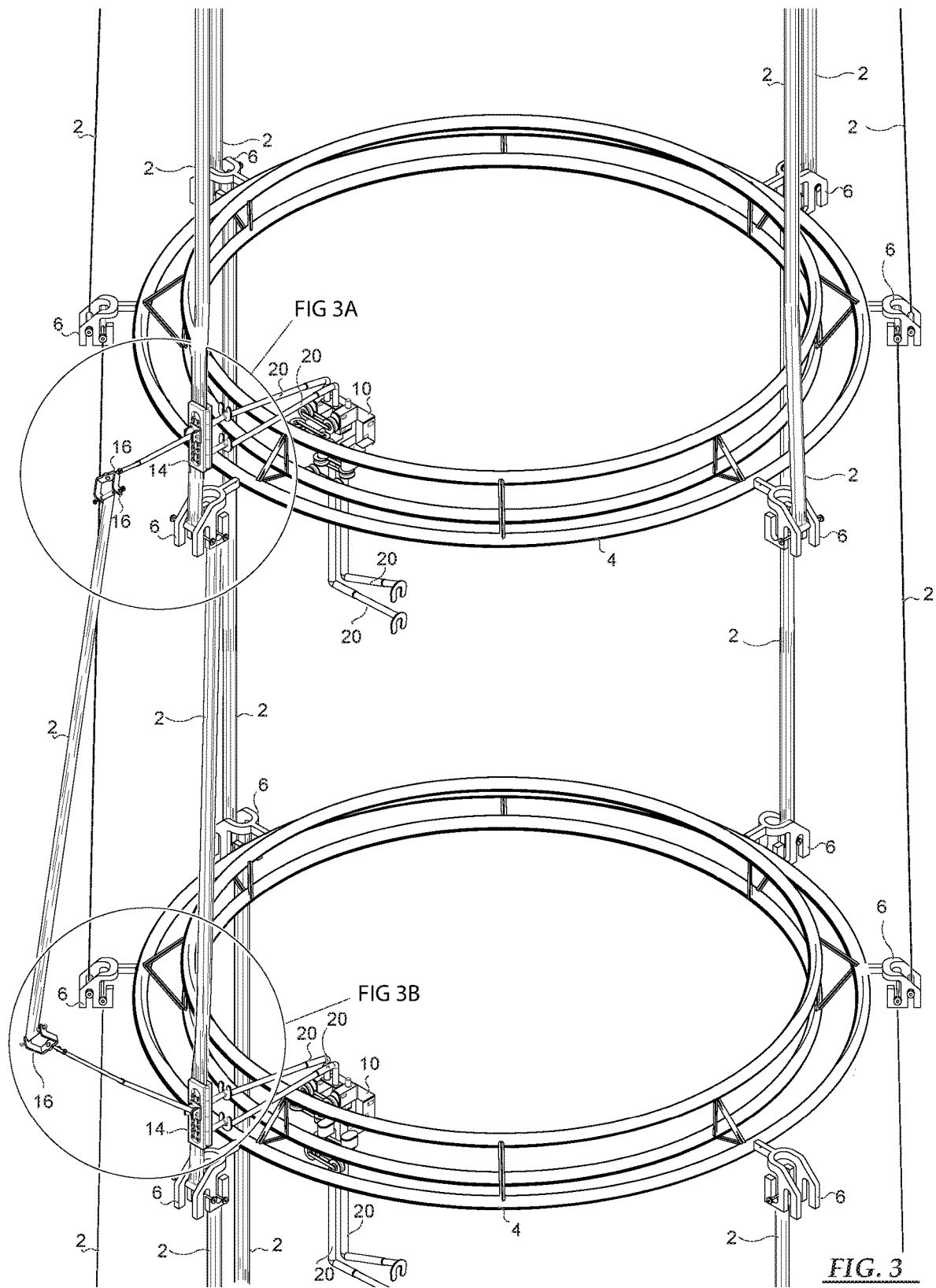
Figure 3A:
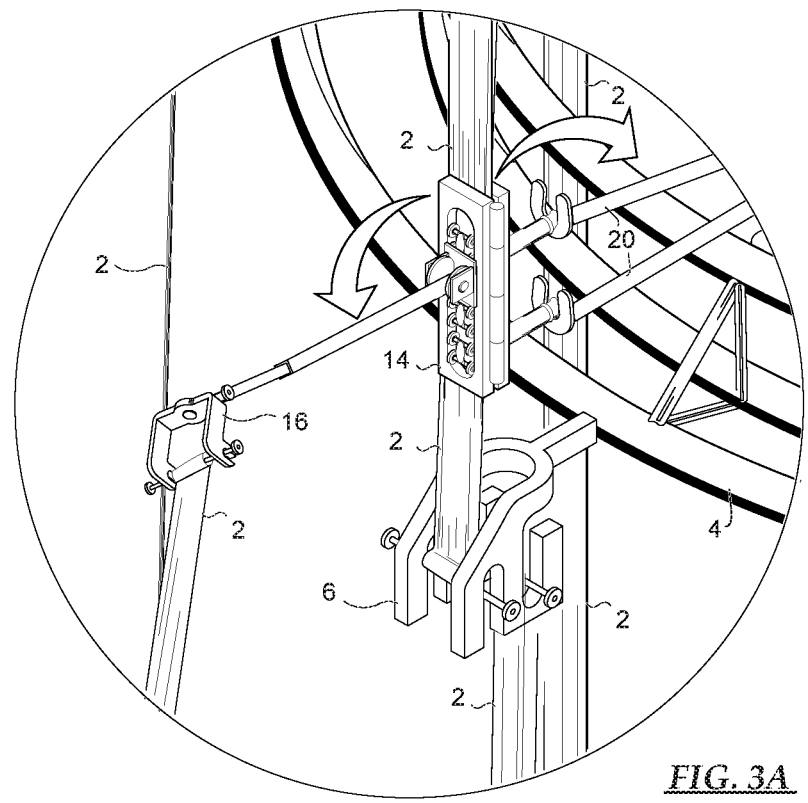
FIG. 3A illustrates an enlarged view of a detail of the modular tether of FIG. 3, showing the process whereby the upper climber decouples from the cable, in preparation for being transported by the taxi along the scaffold of the upper junction from one anchor position to another.
Figure 3B:
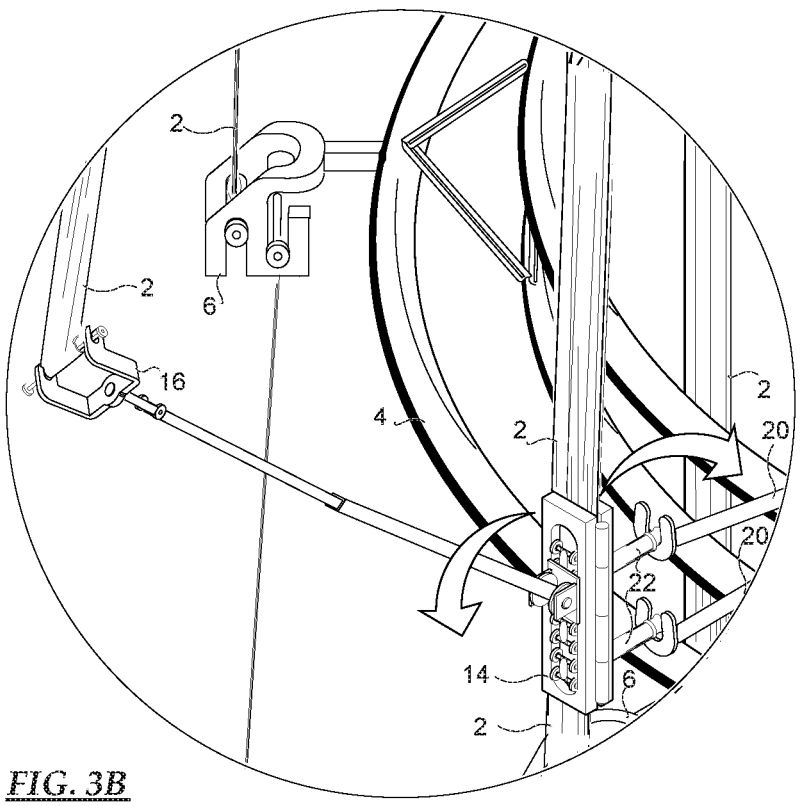
FIG. 3B illustrates an enlarged view of a detail of the modular tether of FIG. 3, showing in detail the process whereby the lower climber decouples from the cable, in preparation for being transported by the taxi along the scaffold of the lower junction from one anchor position to another.

FIGS. 3, 3A, and 3B illustrate a process whereby the lower climber (14) descends down the entire length of the tether module between the upper and lower junctions (4), so as to unspool the spool of new or replacement cable (2, 18) therebetween. FIG. 3A illustrates the process whereby the upper climber (14) disengages from the cable (2) to which it was engaged. FIG. 3B illustrates the process whereby the lower climber (14) first couples to the taxi (10) on the lower junction (4) and then disengages from the cable (2) to which it was engaged. Once both the upper and lower climbers are disengaged from their respective cables and coupled to the taxis (10) to which they are adjacent, the unspooled cable (2) is ready to be transported along the upper and lower junctions (4) to an unoccupied anchor position (6).

Figure 4:
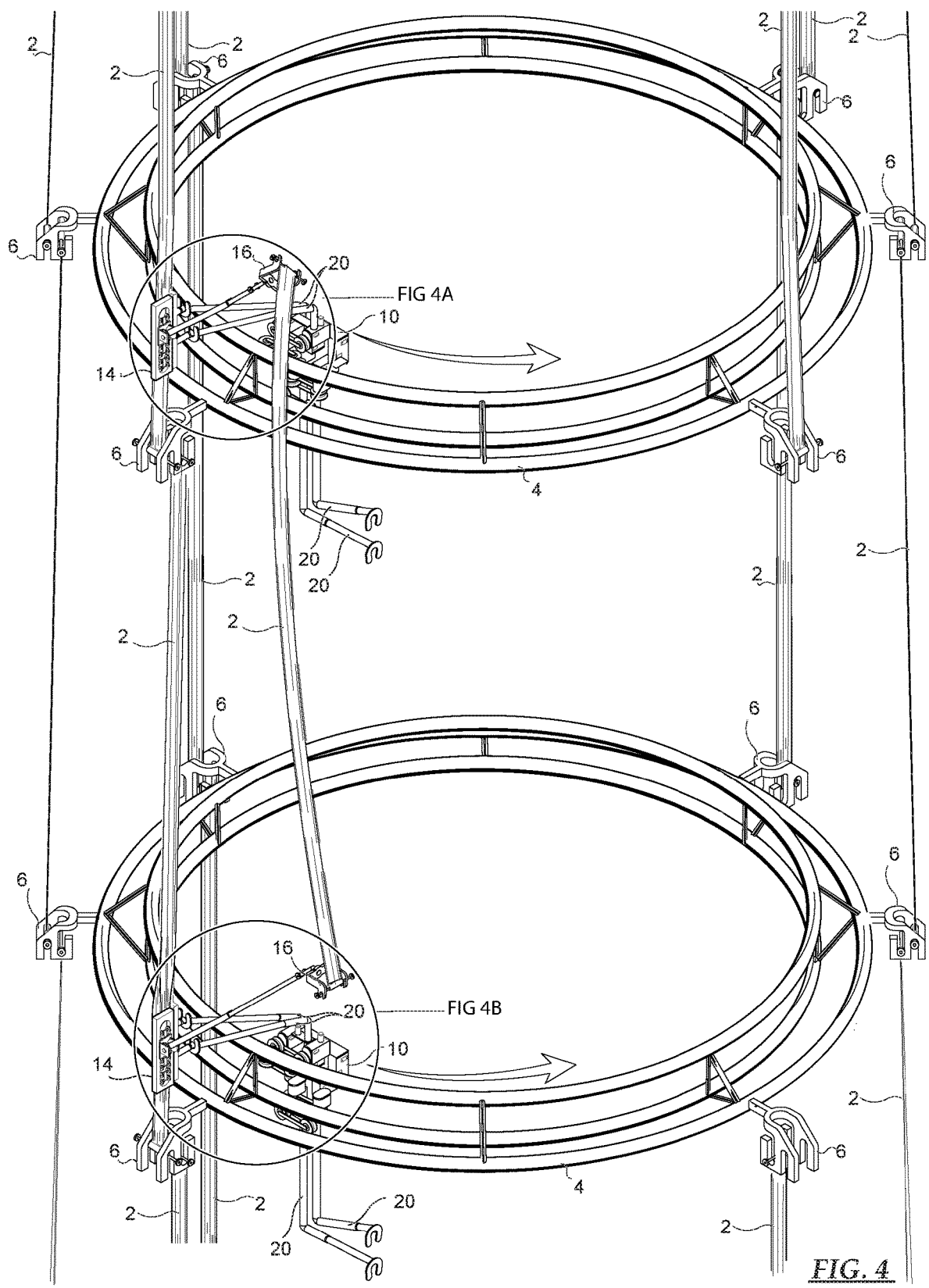
Figure 4A:
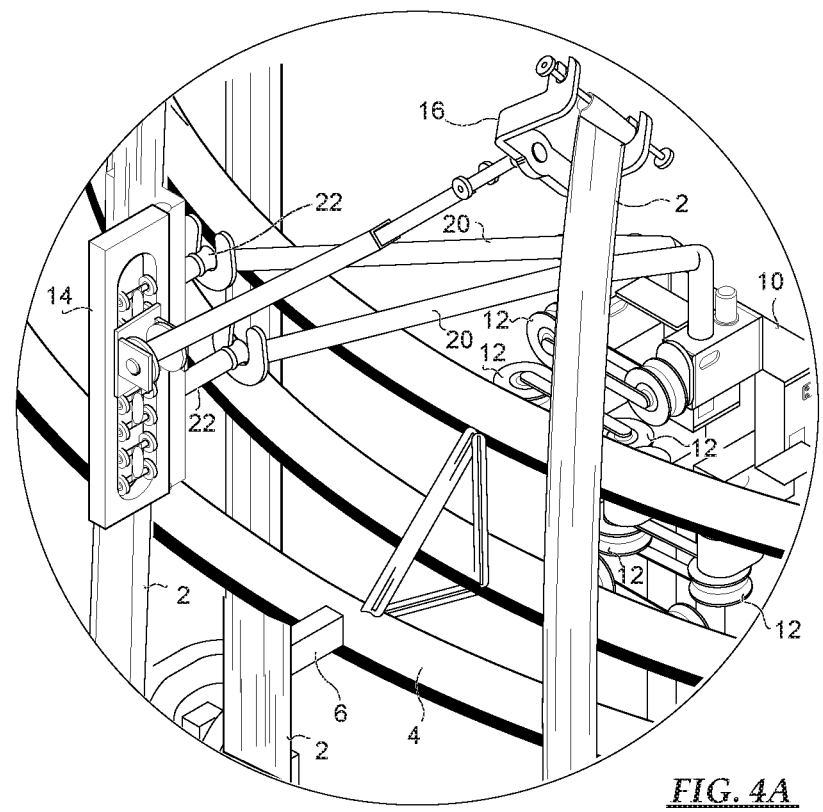
FIG. 4A illustrates an enlarged view of a detail of the modular tether of FIG. 4, showing in detail the upper climber after it has decoupled from the cable, prior to being carried along the upper junction from one anchor position to another by the taxi to which it is coupled.
Figure 4B:
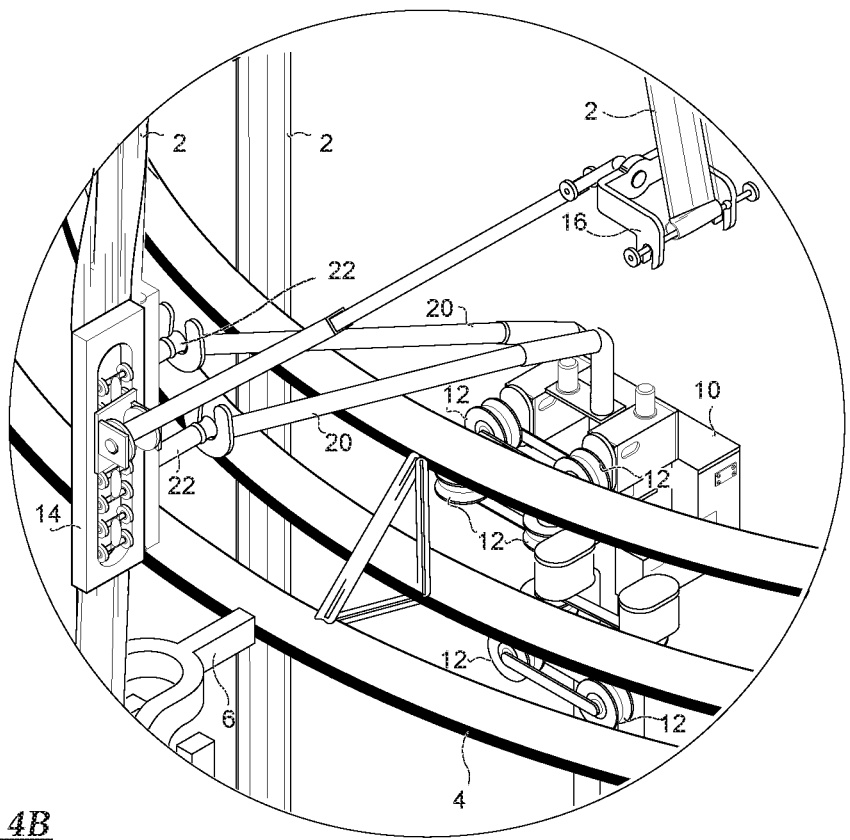
FIG. 4B illustrates an enlarged view of a detail of the modular tether of FIG. 4, showing the lower climber after it has decoupled from the cable, prior to being carried along the lower junction from one anchor position to another by the taxi to which it is coupled.

FIGS. 4, 4A, and 4B illustrate a process whereby the unspooled new or replacement cable (2), together with the upper and lower climbers (14) (disengaged from their respective cables) to which the unspooled cable is coupled, are simultaneously transported by the upper and lower taxis (10) along the upper and lower junctions (4) from an occupied anchor position (6) to an unoccupied anchor position (6).

Figure 5:
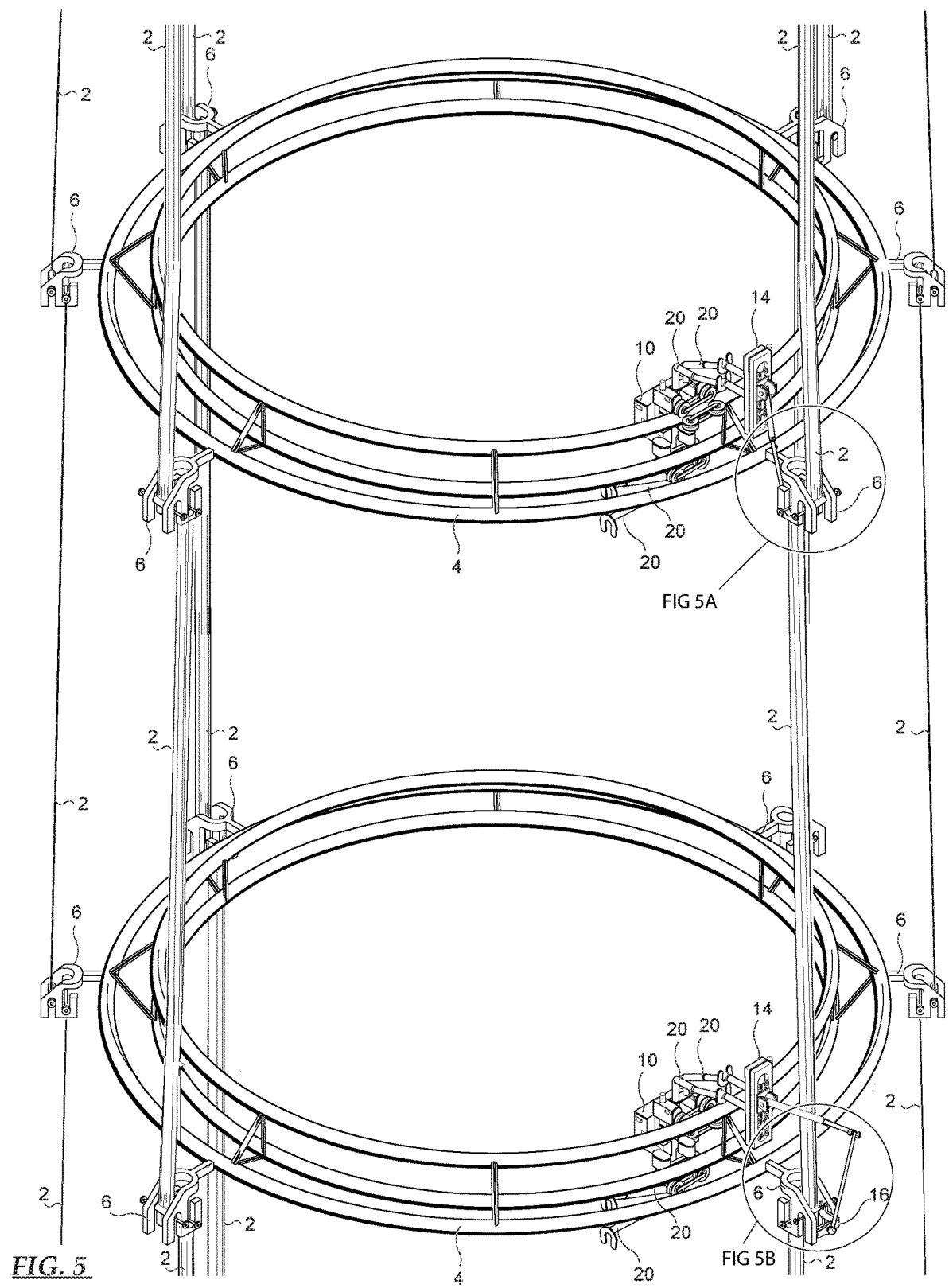
Figure 5A:
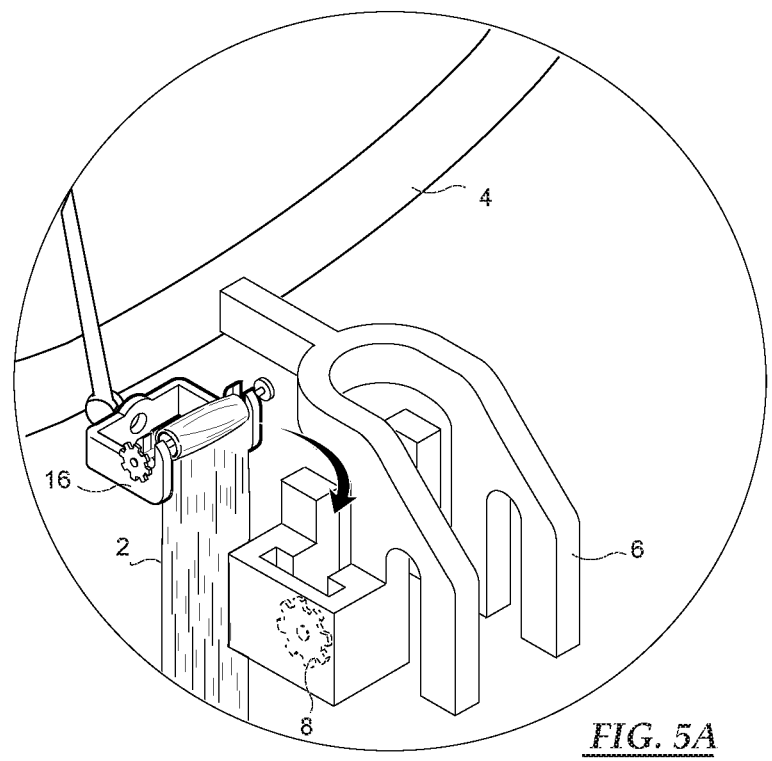
FIG. 5A illustrates an enlarged view of a detail of the modular tether of FIG. 5, schematically showing a winch type anchor attached to the upper junction and a process whereby the unspooled replacement cable becomes coupled to the anchor on the upper junction while under tension. The winch may serve to adjust the tension of the cable attached to it.
Figure 5B:
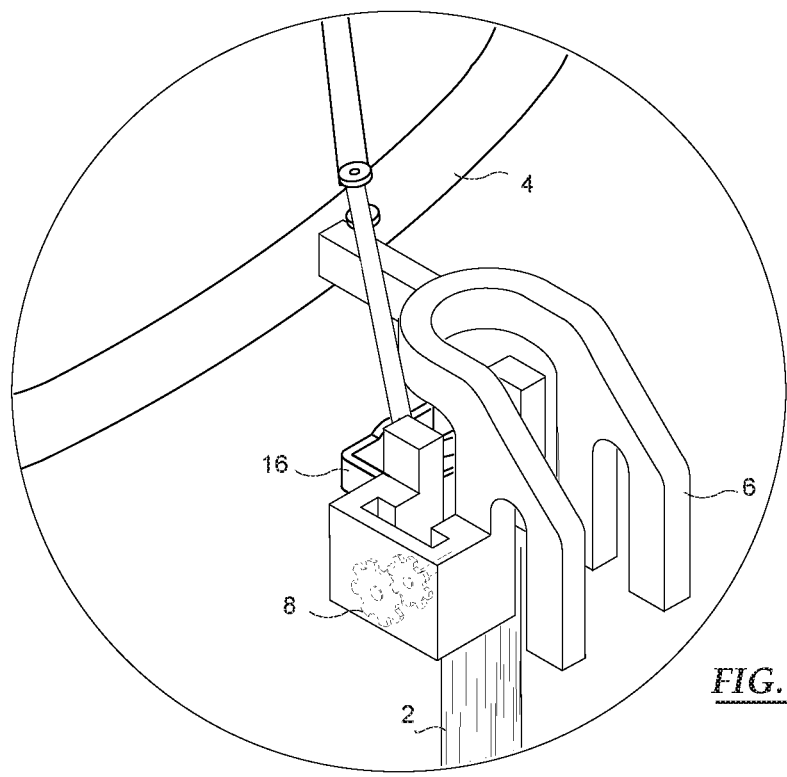
FIG. 5B illustrates an enlarged view of a detail of the modular tether of FIG. 5, schematically showing a winch type anchor attached to the lower junction and a process whereby the unspooled replacement cable becomes coupled to the anchor on the lower junction while under tension. The winch may serve to adjust the tension of the cable attached to it.

FIGS. 5, 5A, and 5B illustrate a process whereby the unspooled new or replacement cable (2) is installed in the tether module between the upper and lower junctions (4). More particularly, the unspooled new or replacement cable (2) is coupled to the unoccupied anchors (6) on the the upper and lower junctions (4) and becomes a functioning cable within the cable bundle of that tether module. FIG. 5 illustrates a process whereby the upper and lower combinations of climbers and taxis, to which the new or replacement cable (2) is coupled, tension the cable (2) and anchor it to the unoccupied anchors (6) on the upper and lower junctions (4). FIGS. 5A and 5B illustrate an alternative process for tensioning the cable (2). In FIGS. 5A and 5B, the unoccupied anchors (6) include a power winch (8). The new or replacement cable (2) is attached to the power winch (8) and the power winch (8) tensions the cable (2). In a further alternative, prior to tensioning the cable, the upper and lower climbers can engage cables above and below the tether module between the upper and lower junctions (4) and then disengage from the taxis (10) to which they are coupled. The upper and lower climbers (14) can then tension the cable (2), prior to attachment to the unoccupied upper and lower anchors (6), by traveling on the cables to which they are engaged. Once the cable (2) is tensioned, it can then be coupled to the unoccupied upper and lower anchors (6).

Figure 6:
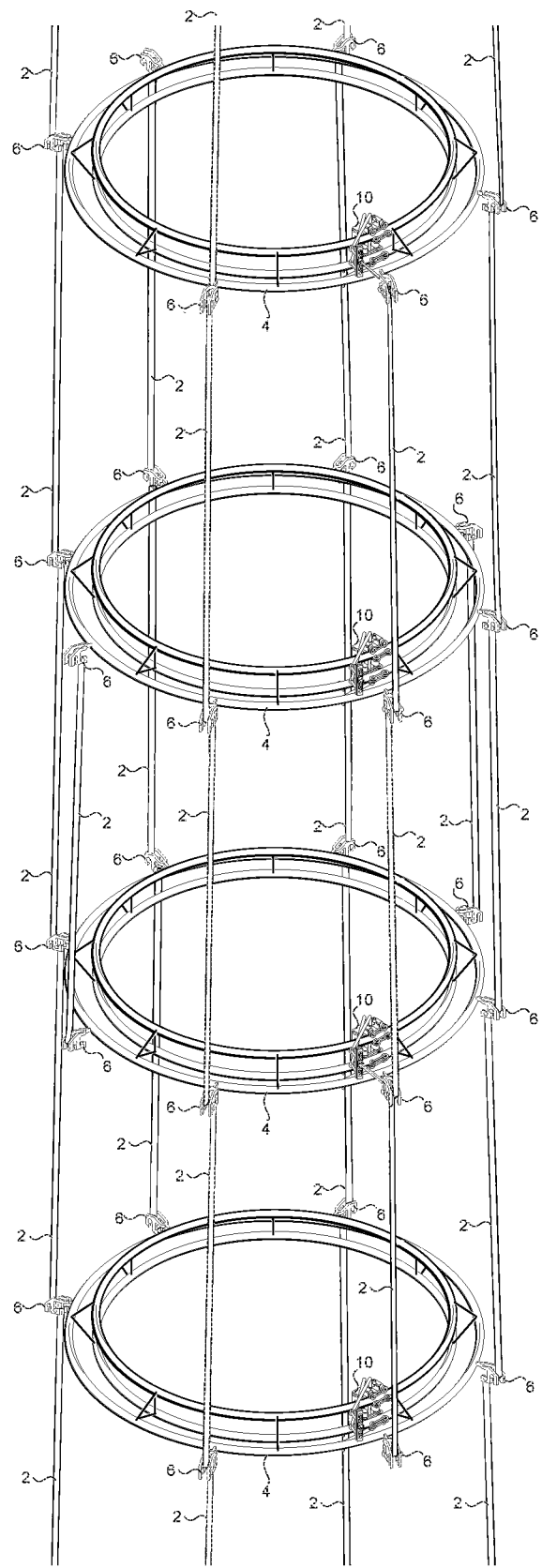
FIG. 6 illustrates a perspective view of a larger segment of the modular tether shown in FIG. 5 and shows tether nodules having different tensile strengths. The tether module in the center has 8 cables connecting adjacent junctions. In contrast, the two tether modules connected to the central tether module have only 6 cables connecting the adjacent junctions. Fragmentary views of further tether modules are shown on either end. These outer fragmentary tether modules have only 4 cables each. The outer tether modules have a lesser tensile strength than the intermediate and central tether modules, because of their fewer number of connecting cables.

FIG. 6 illustrates a perspective view of a larger segment of the modular tether shown in FIG. 5 and shows tether modules having different tensile strengths. The tether module in the center has 8 cables connecting the two junctions (4) of the central tether module. In contrast, the two outer tether modules have only 6 cables connecting the two junctions (4) of the outer tether modules. Due to their having fewer cables, the outer tether modules have a lesser tensile strength than the central tether module.

Winch Modality:

In an alternative embodiment, all of the anchors of a given tether module can include power winches. In this embodiment, the overall length of that particular tether module can be controlled by employing the winches to wind or unwind the cables to which they are attached, in unison. Winding the cables of a given tether module will cause both that particular tether module and the entire modular tether to shorten. In contrast, unwinding cables of a given tether module will cause both that particular tether module and the entire modular tether to lengthen.

Tensile Strength Modality:

The modularity of the tether facilitates its adaptability to new modalities, including modalities that require an alteration of the tether's tensile strength. If there is a change with respect to the function or purpose to which the tether will be applied, it may be useful to increase or decrease its tensile strength, e.g., if there is a need to increase or decrease the load born by the tether. Alternatively, in other applications, the force, e.g., centrifugal force, acting on the tether and the resultant tension therein may vary long its length. For example, multiple loads may be supported by the tether at different positions along its length. In such circumstances, a uniform tensile strength along the entire length of the tether is not necessary. Given the expense of deploying tether material into space, it can be advantageous to construct a tether having a tensile strength that varies along its length to accommodate the anticipated load. The modularity of the tether facilitates the construction of a tether having different tensile strengths within different modules of the tether, in conformance with the anticipated load configuration. Indeed, the modular tether can be assembled or modified with variable tensile strength while the tether is under tension. This can be useful during the initial assembly of the tether in situ. Alternatively, if the anticipated load configuration changes, the tensile strength of the modular tether may be modified while the tether continues to be in use. If the modular tether is employed as a very long sling, the weight of the tether itself might be considered part of the load, with the midsection of the tether requiring a greater tensile strength than the two extremities. In such a circumstance, the tether modules which comprise the midsection may have greater tensile strength than the tether modules at either extremity.

Monitoring Tether Tension:

The modularity of the tether also facilitates a process of monitoring tether stretch and/or elasticity (if any) along its entire length of the tether. It is important for safety reasons to monitor tether stretch and/or elasticity while the tether is in use and to report this data to the tether operator.

In one embodiment, the modular tether may employ strain gauges at the junction points between modules to monitor stretch and/or elasticity of each module. For example, piezoelectric type strain gauges may be installed at tether module junctions to assess the strain between adjacent tether modules. The output of strain gauges are then reported to the tether operator, as needed.

In another embodiment, breakage and/or tear sensors are installed between tether modules to alert the tether operator of critical faults. In a preferred mode, these sensors are integrated with a positioning system so that the fault area could be easily identified. Each modular component is uniquely addressable and, taken together, these sensors work as one larger "self aware" mesh system which translates the various tensile strain to a relatively precise resolution.

In another embodiment, the tether itself is made of piezoelectric materials. A change in the tethers' length or orientation generates a measurable voltage. This change in voltage can be used to identify the tensile forces acting upon the tether at a given time. This property can be used to turn the entire tether into a sensor, rather than attaching individual sensors at points along the tether. This has the benefit of simplifying the system and reducing its mass and power requirements.

Repair State Modality:

The modularity of the tether also facilitates its adaptability to a repair state modality. If the modular tether should require repair, the modular design of the tether facilitates the identification of failed modules and allows faulty or failed components, such as tethers, way stations, and climbers, to be easily repaired and replaced. The functional operation of the tether can be maintained by adding new, functional components before removing faulty components.

The aspect of self fault identification can be likened to a modern car electronics systems which builds fault wiring into the core electronics set, so that a central computer module can identify wither or not other components are functioning normally at any given time. This setup lends itself to redundancy, as the task of fault monitoring can be distributed across several computers.

Situational Control and Positional Awareness Modality:

The modularity of the tether also facilitates its adaptability to a situational control and positional awareness modality. The modular tether may operate effectively within a location regime that is predictable, and can be understood by the Tether operator. That is, the Tether can have movements and location adjustments, but shall return from those excursions to the nominal. The tether will move, or be moved by the operator, for a whole set of operational and environmental reasons; cargo transport, repair activities, safety, and testing. The Tether must know and report these activities to adjacent systems or modules. Active and passive reporting approaches can be utilized.

In one embodiment, GPS receivers may be installed on the tether, e.g., at module junctions and/or on climbers, for monitoring their position. GPS receivers are similarly employed on CubeSats for monitoring their position. GPS units can be designed to have minimal power draw and cycling the GPS units so that they are not on constantly could help reduce power draw. For example, sampling may occur every 10 seconds, 30 seconds, or 1 minute. However, cycling cannot be done too infrequently because the unit must regain a lock on the GPA signals each time it cycles on.

In another embodiment, ground station optical and radio measurements may be employed to track the position of tether modules and climbers equipped with units for transmitting radio signals at regular intervals. A system of ground receivers may be employed to calculate their position. Depending on the length of the tether, it may be preferable to use way stations along the tether to relay the broadcasts to a central ground station.

In another embodiment, inertial measurement units (IMUs) are installed on the modular tether and employed to measure changes in acceleration, both linear three-dimensional and rotational, and numerically integrate these values to calculate velocities and positions at a given point in time. There is a strong heritage of using these on Unmanned Aerial Vehicles (UAVs), aircraft, watercraft, and—more recently—spacecraft. These units are readily available in miniature—most modern smart phones, for example, contain miniature accelerometers—and can be produced to resist the harsh space environment.

Temperature Control Modality:

The modularity of the tether also facilitates its adaptability to a temperature control modality. The temperature control modality facilitates the operation of the modular tether within thermal variances of the Space Environment. The Modular Tether may experience temperature well below −350° F. and above 180° F. These temperature extremes will likely occur at the same time; cold on the "dark side" and warm on the sun lit side. Active and passive measures to control the thermal effects must be part of the Modular Tether.

In one embodiment, the temperature of tether modules in need of temperature management is actively managed through the use of radiator panels paired with a thermally absorbent liquid. The ISS, for example, pumps ammonia throughout the structure to collect heat and vents it through several large panels. The concept is simple and operates similarly to the cooling system on an air conditioning unit or refrigerator.

In another embodiment, the temperature of tether modules in need of temperature management is actively managed by the use of heat sinks. Heat sinks are structures that absorb heat from the surrounding structure, typically because of their material properties (for example, a metallic block in an otherwise plastic structure). In space, a heat sink may be employed to absorb heat from the surrounding structure while slowly dissipating it into the shadowed side of the structure. This method of thermal management is passive and can commonly be found on electronics.

What is claimed is:

1. A modular tether for applying centripetal tension, the modular tether comprising:
   a plurality of tether modules; and
   a plurality of junctions for coupling said tether modules to one another end to end for forming the modular tether;
   said tether modules being attachable and detachable to and from said junctions while the modular tether applies centripetal tension.

2. The modular tether according to claim 1 wherein:
   each of said tether modules including a cable bundle having a plurality of parallel cables.

3. The modular tether according to claim 1 wherein:
   each of said junctions including a scaffold with a plurality of anchors attached thereto for reversibly fastening and unfastening the cables of the cable bundles to and from said junction for assembling, disassembling, repairing, or modifying the modular tether in situ.

4. The modular tether according to claim 3 wherein:
   one or more of the anchors including a power winch for reversibly fastening and unfastening the cable to and from the anchor and for winding and unwinding the cable to and from said junction for adjusting the tension or length of the cable within said tether module.

5. The modular tether according to claim 1 further comprising:
   a taxi having roller coaster type wheels for coupling to one of said junctions and a motive force for propelling said taxi along the junction from one anchor to another.

6. The modular tether according to claim 1 further comprising:
   a camber having a traction coupling with one of the cables and a motive force for propelling the climber by way of the traction coupling with the cable from one junction to another.

7. The modular tether according to claim 6 wherein:
   the traction coupling between said climber and the cables may be decoupled for detaching the climber from the cable.

8. The modular tether according to claim 7, of a type for transporting cargo up and down the tether module, wherein:
   said climber including an extendable claw for hold cargo.

9. The modifier tether according to claim 8 wherein:
   the extendable claw being retractable.

10. The modular tether according to claim 9 further comprising:
    a taxi having miler coaster type wheels for coupling with one of the junctions and a motive force for propelling the taxi along the junction from one anchor to another and a first half of a fifth wheeler type coupler;
    said climber including a second half of the fifth wheeler type coupler for coupling to said taxi.

11. The modular tether according to claim 6 further comprising:
a plurality of GPS sensors attached to said tether modules and/or junctions and/or climbers and coupled to a central computer for providing positional awareness.

12. The modular tether according to claim 6 further comprising:
a plurality of radio transmitters attached to said tether modules and/or junctions and/or climbers for transmitting to ground based receivers for providing positional awareness.

13. The modular tether according to claim 6 further comprising:
a plurality of inertial measurement units attached to said tether modules and/or junctions and/or climbers and coupled to a central computer for providing positional awareness.

14. The modular tether according to claim 1 further comprising:
a plurality of tension gauges, each tension gauge being juxtaposed between adjacent tether modules and coupled thereto for monitoring the tension therein.

15. The modular tether according to claim 1 further comprising:
a plurality of repair state monitors, the repair state monitors being juxtaposed between adjacent tether modules and coupled both thereto and to a central computer for monitoring the repair state of the modular tether.

16. The modular tether according to claim 1 further comprising:
a plurality of heat sinks coupled to said tether modules and/or junctions for managing the temperature of the modular tether.

17. The modular tether according to claim 1 further comprising:
a plurality of radiator panels and heat transfer units coupled to said tether modules and/or junctions for managing the temperature of the modular tether.

18. The modular tether according to claim 1 wherein:
the modular tether having scalable length by adding or removing one or more tether modules to or from the modular tether.

19. The modular tether according to claim 1 wherein:
said plurality of tether modules includes five or more of said tether modules; and
said plurality of junctions includes six or more of said junctions.

20. A process for increasing the tensile strength of a modular tether, the process comprising the following steps:
Step A: applying centripetal tension by means of a modular tether having a series of tether modules coupled to one another by junctions; while simultaneously
Step B: attaching a cable within one of the tether modules to the junction to which the tether module is coupled and tensioning the cable therewith for increasing the tensile strength of the tether module while the modular tether continues to apply the centripetal tension of said Step A.

21. A process for decreasing the tensile strength of a modular tether, the process comprising the following steps:
Step A: applying centripetal tension by means of a modular tether having a series of tether modules coupled to one another by junctions; while simultaneously
Step B: detaching a cable within one of the tether modules from the junction to which the tether module is coupled and de-tensioning the cable therefrom for decreasing the tensile strength of the modular tether while the modular tether continues to apply the centripetal tension of said Step A.

\* \* \* \* \*